United States Patent
Inagaki et al.

(10) Patent No.: US 12,082,345 B2
(45) Date of Patent: Sep. 3, 2024

(54) COMPONENT MOUNTING MACHINE

(71) Applicant: FUJI CORPORATION, Chiryu (JP)

(72) Inventors: Mitsutaka Inagaki, Anjo (JP); Shigeto Oyama, Kariya (JP); Haruna Narita, Higashiura-cho (JP)

(73) Assignee: FUJI CORPORATION, Chiryu (JP)

( * ) Notice: Subject to any disclaimer, the term of this patent is extended or adjusted under 35 U.S.C. 154(b) by 346 days.

(21) Appl. No.: 17/624,183

(22) PCT Filed: Jul. 4, 2019

(86) PCT No.: PCT/JP2019/026681
§ 371 (c)(1),
(2) Date: Dec. 30, 2021

(87) PCT Pub. No.: WO2021/002005
PCT Pub. Date: Jan. 7, 2021

(65) Prior Publication Data
US 2022/0232747 A1    Jul. 21, 2022

(51) Int. Cl.
*H05K 13/08* (2006.01)

(52) U.S. Cl.
CPC ..... *H05K 13/0815* (2018.08); *H05K 13/0812* (2018.08); *H05K 13/0818* (2018.08)

(58) Field of Classification Search
CPC .......... H05K 13/0404; H05K 13/0408; H05K 13/0409; H05K 13/0452; H05K 13/081; H05K 13/0812; H05K 13/0815; H05K 13/0818; H05K 13/085; Y10T 29/4913; Y10T 29/49131; Y10T 29/53174;
(Continued)

(56) References Cited

U.S. PATENT DOCUMENTS

2012/0102726 A1   5/2012   Kaida et al.
2017/0354073 A1* 12/2017  Oyama ............. H05K 13/0815
(Continued)

FOREIGN PATENT DOCUMENTS

CN         102475001 A      5/2012
DE   10 2016 122 494 A1    5/2018
(Continued)

OTHER PUBLICATIONS

JP 2014041857 translation from FIT database (Year: 2024).*
(Continued)

*Primary Examiner* — Jeffrey T Carley
*Assistant Examiner* — Joshua D Anderson
(74) *Attorney, Agent, or Firm* — Oblon, McClelland, Maier & Neustadt, L.L.P.

(57) ABSTRACT

The component mounting machine includes a head, a head moving device, an imaging device, and a control device. The control device executes a lower component mounting operation that mounts a lower component on a board, an upper component mounting operation that mounts an upper component on the lower component mounted on the board, and a lower component mounting inspection operation that images the board on which the lower component is mounted, and performs a mounting inspection of the lower component based on a captured image after the lower component mounting operation is performed and before the upper component mounting operation is performed.

3 Claims, 11 Drawing Sheets

(58) Field of Classification Search
CPC ......... Y10T 29/43178; Y10T 29/53183; Y10T 29/53191

See application file for complete search history.

(56) References Cited

U.S. PATENT DOCUMENTS

| | | | |
|---|---|---|---|
| 2019/0104658 A1* | 4/2019 | Hara | H05K 13/082 |
| 2020/0170156 A1* | 5/2020 | Ohashi | H05K 13/0818 |
| 2022/0256751 A1* | 8/2022 | Inagaki | H05K 13/0015 |

FOREIGN PATENT DOCUMENTS

| | | | | | |
|---|---|---|---|---|---|
| JP | 2007129132 A | * | 5/2007 | | H01L 24/97 |
| JP | 2007158213 A | * | 6/2007 | | |
| JP | 2008251771 A | * | 10/2008 | | |
| JP | 2010123906 A | * | 6/2010 | | |
| JP | 2011077173 A | * | 4/2011 | | |
| JP | 4780017 B2 | * | 9/2011 | | |
| JP | 4780022 B2 | * | 9/2011 | | |
| JP | 2012-89552 A | | 5/2012 | | |
| JP | 2012209300 A | * | 10/2012 | | |
| JP | 2014041857 A | * | 3/2014 | | |
| JP | 2017228670 A | * | 12/2017 | | |
| JP | 2021132051 A | * | 9/2021 | | |
| JP | 2021150550 A | * | 9/2021 | | |
| WO | WO-2015045057 A1 | * | 4/2015 | | H05K 13/0815 |

OTHER PUBLICATIONS

JP 2007129132 translation from FIT database (Year: 2024).*
JP 2007158213 translation from FIT database (Year: 2024).*
JP 2010123906 translation from FIT database (Year: 2024).*
JP 2011077173 translation from FIT database (Year: 2024).*
JP 2021132051 translation from FIT database (Year: 2024).*
JP 2021150550 translation from FIT database (Year: 2024).*
JP 2008251771 translation from FIT database (Year: 2024).*
JP 4780017 translation from FIT database (Year: 2024).*
JP 4780022 translation from FIT database (Year: 2024).*
JP 2012209300 translation from FIT database (Year: 2024).*
JP 2017228670 translation from FIT database (Year: 2024).*
WO 2015045057 translation from FIT database (Year: 2024).*
International Search Report mailed on Oct. 1, 2019 in PCT/JP2019/026681 filed on Jul. 4, 2019, 2 pages.

* cited by examiner

Fig. 4

| SEQUENCE NUMBER | COMPONENT TYPE | PICKUP NUMBER |
|---|---|---|
| 1 | COMPONENT A | 1 |
| 2 | COMPONENT A | 1 |
| 3 | COMPONENT A | 1 |
| 4 | COMPONENT A | 1 |
| 5 | COMPONENT A | 2 |
| 6 | COMPONENT A | 2 |
| 7 | COMPONENT A | 2 |
| 8 | COMPONENT A | 2 |
| 9 | COMPONENT A | 3 |
| 10 | COMPONENT A | 3 |
| 11 | COMPONENT A | 3 |
| 12 | COMPONENT A | 3 |
| 13 | COMPONENT B | 4 |
| 14 | COMPONENT B | 4 |
| 15 | COMPONENT B | 4 |
| 16 | COMPONENT B | 4 |
| 17 | COMPONENT B | 5 |
| 18 | COMPONENT B | 5 |
| 19 | COMPONENT D | 5 |
| 20 | COMPONENT D | 5 |
| 21 | COMPONENT D | 6 |
| 22 | COMPONENT D | 6 |
| 23 | COMPONENT D | 6 |
| 24 | COMPONENT D | 6 |
| 25 | COMPONENT C | 7 |
| 26 | COMPONENT C | 8 |
| 27 | COMPONENT C | 9 |

| FIRST INSPECTION MODE | |
|---|---|
| INSPECTION | RELATED PP NUMBER (COMPONENT INSPECTION AFTER PERFORMING HERE) |
| COMPONENT INSPECTION 1 | 6 |
| COMPONENT INSPECTION 2 | 7 |
| COMPONENT INSPECTION 3 | 8 |

| SECOND INSPECTION MODE | |
|---|---|
| INSPECTION | RELATED PP NUMBER (COMPONENT INSPECTION AFTER PERFORMING HERE) |
| COMPONENT INSPECTION 1 | 6 |
| COMPONENT INSPECTION 2 | 6 |
| COMPONENT INSPECTION 3 | 6 |

Fig. 8A

| FIRST INSPECTION MODE | |
|---|---|
| INSPECTION | RELATED PP NUMBER (COMPONENT INSPECTION AFTER PERFORMING HERE) |
| COMPONENT INSPECTION 1 | 7 |
| COMPONENT INSPECTION 2 | 8 |
| COMPONENT INSPECTION 3 | 9 |

Fig. 8B

| SECOND INSPECTION MODE | |
|---|---|
| INSPECTION | RELATED PP NUMBER (COMPONENT INSPECTION AFTER PERFORMING HERE) |
| COMPONENT INSPECTION 1 | 7 |
| COMPONENT INSPECTION 2 | 7 |
| COMPONENT INSPECTION 3 | 7 |

Fig. 9A

| FIRST INSPECTION MODE | |
|---|---|
| PP NUMBER | PERFORM INSPECTION |
| 1 | ABSENT |
| 2 | ABSENT |
| 3 | ABSENT |
| 4 | ABSENT |
| 5 | ABSENT |
| 6 | COMPONENT INSPECTION 1 |
| 7 | COMPONENT INSPECTION 2 |
| 8 | COMPONENT INSPECTION 3 |

Fig. 9B

| SECOND INSPECTION MODE | |
|---|---|
| PP NUMBER | PERFORM INSPECTION |
| 1 | ABSENT |
| 2 | ABSENT |
| 3 | ABSENT |
| 4 | ABSENT |
| 5 | ABSENT |
| 6 | COMPONENT INSPECTION 1<br>COMPONENT INSPECTION 2<br>COMPONENT INSPECTION 3 |
| 7 | ABSENT |
| 8 | ABSENT |

Fig. 10A

| FIRST INSPECTION MODE ||||
|---|---|---|---|
| WORK NUMBER | WORK CONTENTS | WORK TARGET | WORK GROUP NUMBER |
| 1 | COMPONENT MOUNTING | COMPONENT A | 1 |
| 2 | COMPONENT MOUNTING | COMPONENT A | 1 |
| 23 | COMPONENT MOUNTING | COMPONENT D | 6 |
| 24 | COMPONENT MOUNTING | COMPONENT D | 6 |
| 25 | COMPONENT INSPECTION | INSPECTION 1 | 7 |
| 26 | COMPONENT MOUNTING | COMPONENT C | 8 |
| 27 | COMPONENT INSPECTION | INSPECTION 2 | 9 |
| 28 | COMPONENT MOUNTING | COMPONENT C | 10 |
| 29 | COMPONENT INSPECTION | INSPECTION 3 | 11 |
| 30 | COMPONENT MOUNTING | COMPONENT C | 12 |

Fig. 10B

| SECOND INSPECTION MODE ||||
|---|---|---|---|
| WORK NUMBER | WORK CONTENTS | WORK TARGET | WORK GROUP NUMBER |
| 1 | COMPONENT MOUNTING | COMPONENT A | 1 |
| 2 | COMPONENT MOUNTING | COMPONENT A | 1 |
| 23 | COMPONENT MOUNTING | COMPONENT D | 6 |
| 24 | COMPONENT MOUNTING | COMPONENT D | 6 |
| 25 | COMPONENT INSPECTION | INSPECTION 1 | 7 |
| 26 | COMPONENT INSPECTION | INSPECTION 2 | 8 |
| 27 | COMPONENT INSPECTION | INSPECTION 3 | 9 |
| 28 | COMPONENT MOUNTING | COMPONENT C | 10 |
| 29 | COMPONENT MOUNTING | COMPONENT C | 11 |
| 30 | COMPONENT MOUNTING | COMPONENT C | 12 |

Fig. 12A

| FIRST INSPECTION MODE | |
|---|---|
| INSPECTION TYPE | RELATED PP NUMBER (LOWER COMPONENT INSPECTION AFTER PERFORMING THIS) |
| LOWER COMPONENT INSPECTION 1 | 6 |
| LOWER COMPONENT INSPECTION 2 | 7 |
| LOWER COMPONENT INSPECTION 3 | 8 |
| UPPER COMPONENT INSPECTION 1 | 9 |
| UPPER COMPONENT INSPECTION 2 | 9 |
| UPPER COMPONENT INSPECTION 3 | 9 |

Fig. 12B

| SECOND INSPECTION MODE | |
|---|---|
| INSPECTION TYPE | RELATED PP NUMBER (LOWER COMPONENT INSPECTION AFTER PERFORMING THIS) |
| LOWER COMPONENT INSPECTION 1 | 6 |
| LOWER COMPONENT INSPECTION 2 | 6 |
| LOWER COMPONENT INSPECTION 3 | 6 |
| UPPER COMPONENT INSPECTION 1 | 9 |
| UPPER COMPONENT INSPECTION 2 | 9 |
| UPPER COMPONENT INSPECTION 3 | 9 |

COMPONENT MOUNTING MACHINE

TECHNICAL FIELD

The present specification discloses a component mounting machine.

BACKGROUND ART

Conventionally, a component mounting system including a component mounting machine for mounting a component on a board and an inspection device for inspecting a mounting state of the component mounted on the board has been proposed (refer to Patent Literature 1, for example). The component mounting system stores mounting and inspection data in which a component type, a mounting position coordinate, an inspection timing, and the like are associated with each other, executes component mounting based on the component type and the mounting position coordinate, and executes component inspection of a target component at the inspection timing.

PATENT LITERATURE

Patent Literature 1: JP-A-2012-89552

BRIEF SUMMARY

Technical Problem

However, in the component mounting system described above, there is a case where it is not possible to sufficiently respond to a need of the users. In a component mounting machine for mounting an upper component (for example, frame component) on a lower component after the lower component is mounted on the board, when the upper component is mounted, the lower component is covered with the upper component and concealed by the upper component. Therefore, the mounting inspection of the lower component needs to be performed before the upper component is mounted. At this time, in a case where multiple lower components are mounted and each of the upper components is mounted on different lower components among the multiple mounted lower components, in order to enhance the reliability of the inspection (for example, in order to avoid the invading of foreign matter or the like after the mounting inspection of the lower component is performed until the upper component is mounted on the lower component), it is conceivable that the component mounting machine performs the mounting inspection of the multiple lower components at the timing immediately before mounting the upper component that comes on top of each. However, for a user who gives priority to the production efficiency than the reliability of the inspection, the inspection timing described above is not necessarily an appropriate timing.

In a component mounting machine that mounts multiple lower components on a board and mounts each of upper components on different lower components among the multiple lower components, a main object of the present disclosure is to provide a component mounting machine that can respond to different needs of users in a case where a mounting inspection of lower components is performed.

Solution to Problem

The present disclosure adopts the following means to achieve the main object described above.

A component mounting machine of the present disclosure that mounts a component on a board, the component mounting machine, and it is a gist to include a head configured to hold the component; a head moving device configured to move the head; an imaging device provided to move together with the head by the head moving device and configured to image the board; and a control device configured to execute a lower component mounting operation that controls the head and the head moving device so that a lower component is mounted on the board, an upper component mounting operation that controls the head and the head moving device so that an upper component is mounted on the lower component mounted on the board, and a lower component mounting inspection operation that controls the imaging device and the head moving device so as to image the board on which the lower component is mounted and performs a mounting inspection of the lower component based on a captured image of the board after the lower component mounting operation is performed and before the upper component mounting operation is performed, in which in a case where each of the upper components is mounted on different lower components among multiple lower components mounted on the board, the control device executes the lower component mounting inspection operation in an inspection mode selected from multiple inspection modes including a first inspection mode in which the mounting inspection of the lower component located below the upper component of a mounting target is performed immediately before the upper component mounting operation of each of the upper components is performed as an execution timing of the lower component mounting inspection operation and a second inspection mode in which all mounting inspections of the multiple lower components are continuously performed.

The control device of the component mounting machine of the present disclosure executes the lower component mounting operation, the upper component mounting operation, and the lower component mounting inspection operation that performs the mounting inspection of the lower component after the lower component mounting operation is performed and before the upper component mounting operation is performed. In addition, in a case where each of the upper components is mounted on different lower components among multiple lower components mounted on the board, the control device executes the lower component mounting inspection operation in the inspection mode selected from multiple inspection modes including the first inspection mode and the second inspection mode. The first inspection mode is a mode in which the mounting inspection of the lower component located below the upper component of a mounting target is performed immediately before the upper component mounting operation of each of the upper components is performed as the execution timing of the lower component mounting inspection operation, and the second inspection mode is a mode in which all mounting inspections of multiple lower components are continuously performed. As a result, it is possible to appropriately respond to user needs by performing the lower component mounting inspection operation in the first inspection mode for a user who gives a priority to the reliability of the inspection, and in the second inspection mode for a user who gives a priority to the production efficiency than the reliability of the inspection.

BRIEF DESCRIPTION OF DRAWINGS

FIG. 4 is an explanatory table illustrating an example of mounting sequence data of components A to D.

FIG. 8A is an explanatory table illustrating inspection timing setting data of a modification example.

FIG. 8B is an explanatory table illustrating inspection timing setting data of the modification example.

FIG. 9A is an explanatory table illustrating inspection timing setting data of the modification example.

FIG. 9B is an explanatory table illustrating inspection timing setting data of the modification example.

FIG. 10A is an explanatory table illustrating an example of work sequence data.

FIG. 10B is an explanatory table illustrating an example of work sequence data.

FIG. 12A is an explanatory table illustrating inspection timing setting data of the modification example.

FIG. 12B is an explanatory table illustrating inspection timing setting data of the modification example.

DESCRIPTION OF EMBODIMENTS

Next, embodiments for performing the present disclosure will be described using examples.

Figure 1:
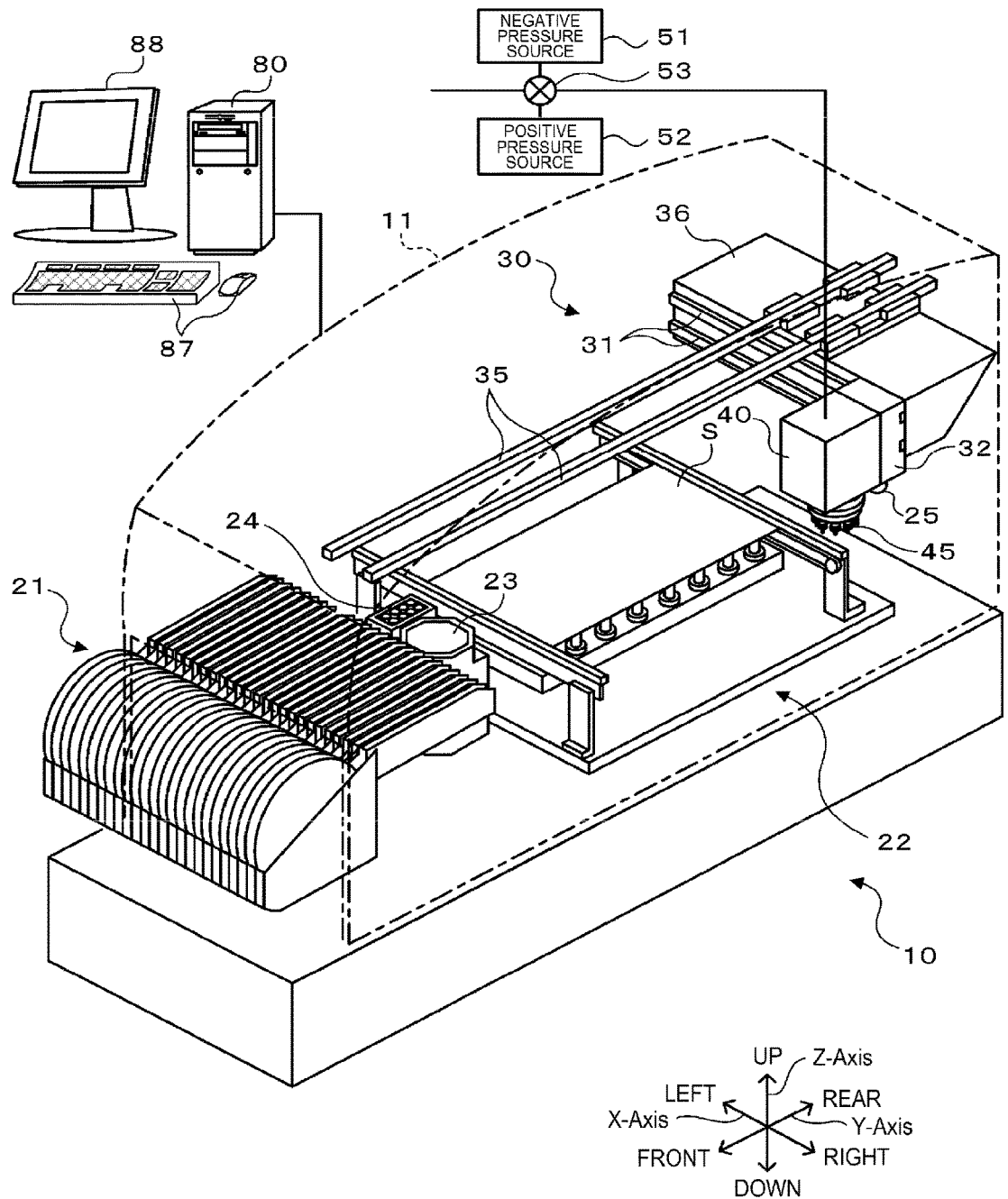
FIG. 1 is a configuration view illustrating an outline of a configuration of component mounting machine 10 of the present embodiment.
Figure 2:
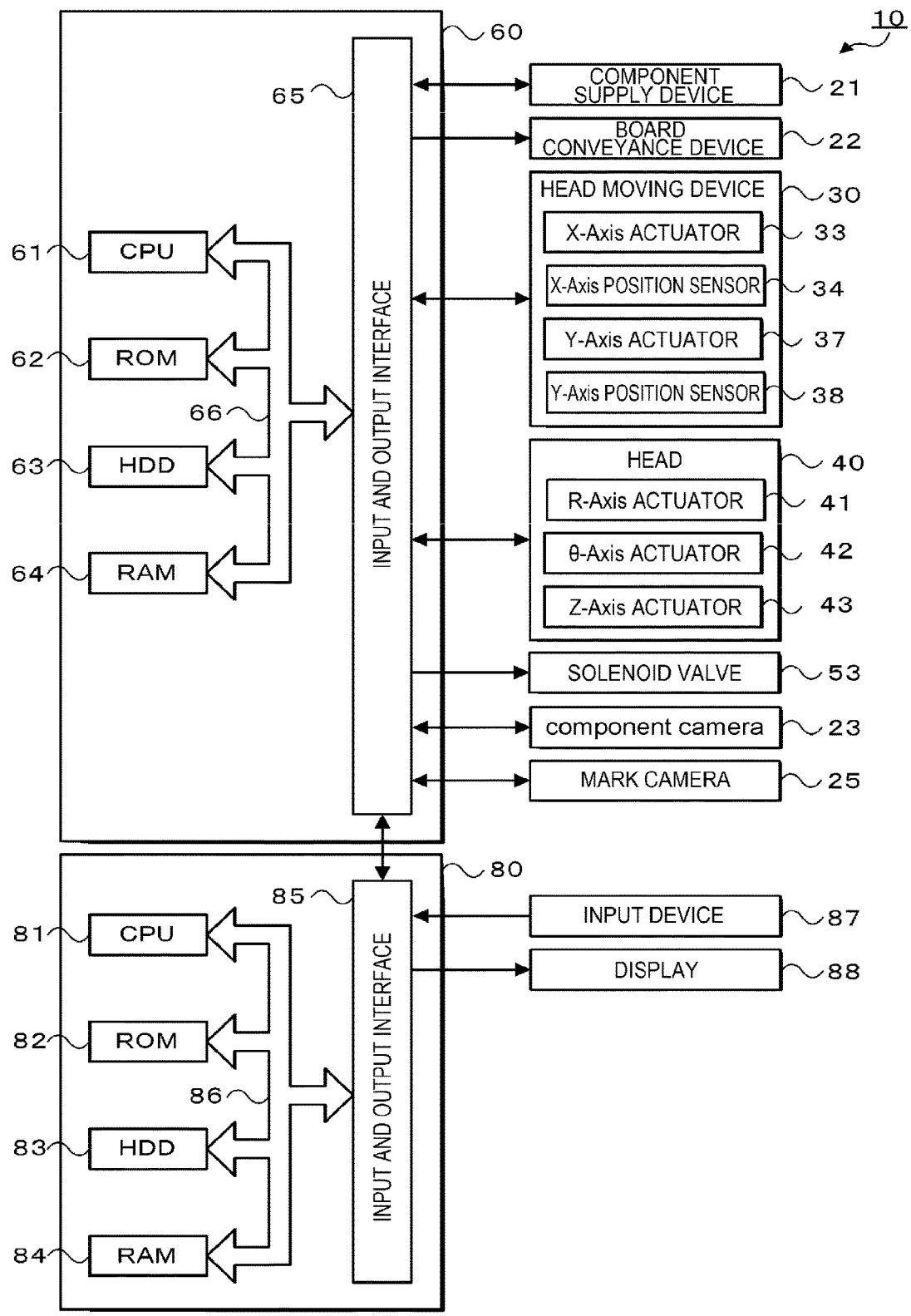
FIG. 2 is an explanatory diagram illustrating an electrical connection relationship between control device 60 and management device 80 of component mounting machine 10.

FIG. 1 is a configuration view illustrating an outline of a configuration of component mounting machine 10 of the present embodiment. FIG. 2 is an explanatory diagram illustrating an electrical connection relationship between control device 60 and management device 80 of component mounting machine 10. In FIG. 1, the left-right direction denotes the X-axis direction, the front-rear (depth) direction denotes the Y-axis direction, and the up-down direction denotes the Z-axis direction.

As illustrated in FIG. 1, component mounting machine 10 is provided with component supply device 21 for supplying the component, board conveyance device 22 for conveying board S, head 40 for picking up (suction pickup) the component using suction nozzles 45, head moving device 30 for moving head 40 in the X-axis direction and the Y-axis direction, and control device 60 (refer to FIG. 2) for controlling the entire mounting machine. In addition, in addition to these devices, component mounting machine 10 also is provided with component camera 23 for imaging a posture of the picked-up component, nozzle station 24 for accommodating suction nozzle 45 for exchange, mark camera 25 for imaging a positioning reference mark attached to board S, and the like. Multiple component mounting machines 10 are arranged side by side in the board conveyance direction (X-axis direction) to form a production line. The production line is managed by management device 80.

Component supply device 21 is configured as a tape feeder including, for example, a tape reel on which a carrier tape accommodating the components at predetermined intervals is wound, and a tape feeding mechanism for drawing the carrier tape from the tape reel by driving of a driving motor to feed the carrier tape to a component supply position. Component supply device 21 (tape feeder) is detachably attached to a feeder base (not illustrated) provided in component mounting machine 10.

Board conveyance device 22 is provided with a pair of conveyor rails disposed at intervals in the Y-axis direction, and conveys board S from the left to the right in FIG. 1 (board conveyance direction) by driving the pair of conveyor rails.

As illustrated in FIG. 1, head moving device 30 is provided with a pair of X-axis guide rails 31, X-axis slider 32, X-axis actuator 33 (refer to FIG. 2), a pair of Y-axis guide rails 35, Y-axis slider 36, and Y-axis actuator 37 (refer to FIG. 2). The pair of Y-axis guide rails 35 are disposed on an upper stage of housing 11 so as to extend parallel to each other in the Y-axis direction. Y-axis slider 36 is spanned by the pair of Y-axis guide rails 35, and moves in the Y-axis direction along Y-axis guide rail 35 by the driving of Y-axis actuator 37. The pair of X-axis guide rails 31 are disposed on a front surface of Y-axis slider 36 so as to extend parallel to each other in the X-axis direction. X-axis slider 32 is spanned by the pair of X-axis guide rails 31, and moves in the X-axis direction along X-axis guide rail 31 by the driving of X-axis actuator 33. Head 40 is attached to X-axis slider 32, and head moving device 30 moves head 40 in the X-axis direction and the Y-axis direction by moving X-axis slider 32 and Y-axis slider 36.

In the present embodiment, head 40 is configured as a rotary head including multiple (for example, four) nozzle holders arranged at equal angular intervals in the circumferential direction. Head 40 is provided with R-axis actuator 41 that pivots multiple nozzle holders in the circumferential direction, θ-axis actuator 42 that rotates (revolves) multiple nozzle holders, and Z-axis actuator 43 that raises and lowers (up and down) the nozzle holder at a predetermined pivoted position among multiple nozzle holders. Suction nozzle 45 is detachably attached to a tip portion of each nozzle holder. As illustrated in FIG. 1, the suction port of suction nozzle 45 selectively communicates with negative pressure source 51, positive pressure source 52, and the air introduction port via solenoid valve 53. Head 40 can pick up the component by acting a negative pressure on the suction port by driving solenoid valve 53 so that the suction port of suction nozzle 45 communicates with negative pressure source 51. In addition, by driving solenoid valve 53 so that the suction port of suction nozzle 45 communicates with positive pressure source 52, head 40 can act a positive pressure on the suction port to release the pickup of the component.

When the component picked up by suction nozzle 45 passes above component camera 23, component camera 23 images the component and outputs the obtained captured image to control device 60. Control device 60 determines the amount of positional deviation (amount of pickup deviation) of the picked-up component or determines the presence or absence of a pickup error by performing image processing of recognizing the component in the captured image.

Mark camera 25 is attached to X-axis slider 32, and moves in the X-axis direction and the Y-axis direction together with head 40 by head moving device 30. When board S is carried in, mark camera 25 images the positioning reference mark attached to board S, and outputs the obtained captured image to control device 60. Control device 60 confirms the position of conveyed in board S by performing image processing for recognizing the positioning reference mark in the captured image.

As illustrated in FIG. 2, control device 60 is configured as a microprocessor centered on CPU 61, and is provided with ROM 62, HDD 63, RAM 64, and input and output interface 65, in addition to CPU 61. These are electrically connected to one another via bus 66. A position signal from X-axis position sensor 34 for sensing the position of X-axis slider 32, a position signal from Y-axis position sensor 38 for sensing the position of Y-axis slider 36, an image signal from component camera 23, an image signal from mark camera 25, and the like are input to control device 60 via input and output interface 65. On the other hand, a control signal to component supply device 21, a control signal to board conveyance device 22, a drive signal to X-axis actuator 33, a drive signal to Y-axis actuator 37, a drive signal to R-axis actuator 41, a drive signal to θ-axis actuator 42, a drive signal to Z-axis actuator 43, a drive signal to solenoid valve 53, a drive signal to component camera 23, a drive signal to mark camera 25, and the like are output from control device 60 via input and output interface 65. In addition, control device 60 is connected to management device 80 so as to be capable of bidirectional communication, and exchanges data and control signals with each other.

For example, management device 80 is a general-purpose computer, and is provided with CPU 81, ROM 82, HDD 83, RAM 84, input and output interface 85, and the like, as illustrated in FIG. 2. These are electrically connected to one another via bus 86. An input signal from input device 87 such as a mouse and a keyboard is input to management device 80 via input and output interface 85. In addition, an image signal to display 88 is output from management device 80 via input and output interface 85. HDD 83 stores a production job of board S. Here, the production job of board S includes a production schedule such as which components are mounted on board S in which order in each component mounting machine 10, and how many sheets of board S on which the components are mounted in this manner are prepared. Management device 80 generates a production job based on various types of data input by an operator via input device 87, transmits the generated production job to each component mounting machine 10, and thus instructs each component mounting machine 10 to start production.

Figure 3:
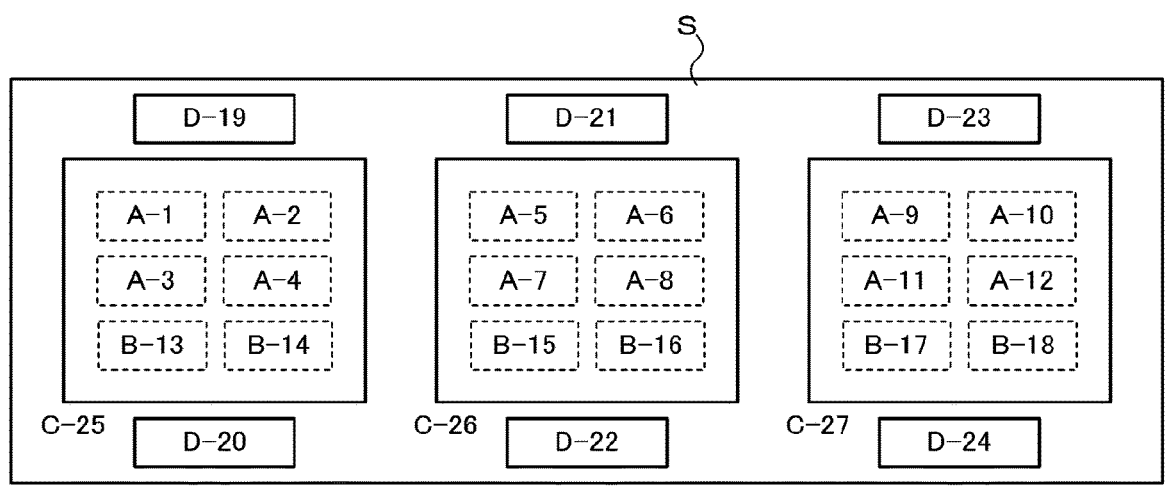
FIG. 3 is an explanatory diagram illustrating an example of board S on which components A to D are mounted.

Next, an operation of component mounting machine 10 of the present embodiment configured as described above will be described. In particular, as illustrated in FIG. 3, in a case where lower components A and B are mounted on board S and upper component (frame component) C is mounted so as to cover different lower components among mounted lower components A and B from above, a mounting inspection to be performed on lower components A and B will be described. In FIG. 3, the alphabetic character indicates a component type, and the numeral indicates the mounting order of the components. The mounting order of the components is determined according to a mounting sequence included in the production schedule. In the mounting sequence, in the present embodiment, the mounting order is determined so that the mounting of each component is efficiently performed. An example of the mounting sequence of components A to D is illustrated in FIG. 4. The mounting of components according to the mounting sequence illustrated in FIG. 4 is performed as follows. That is, component mounting machine 10 first mounts lower components A-1 to A-12, and B-13 to B-18 in order at designated mounting positions with lower components A-1 to A-4, B-13, and B-14, lower components A-5 to A-8, B-15, and B-16, and lower components A-9 to A-12, B17, and B-18 as one set, respectively. Next, component mounting machine 10 sequentially mounts other components D-19 to D24 at designated mounting positions that do not interfere with upper components C-25 to C-27 to be mounted on lower components A-1 to A-12, and B-13 to B-18 later. Component mounting machine 10 mounts upper component C-25 on lower components A-1 to A-4, B-13, and B-14, upper component C-26 on lower components A-5 to A-8, B-15, and B-16, and upper component C-27 on lower components A-9 to A-12, B-17, and B-18.

Figure 5:
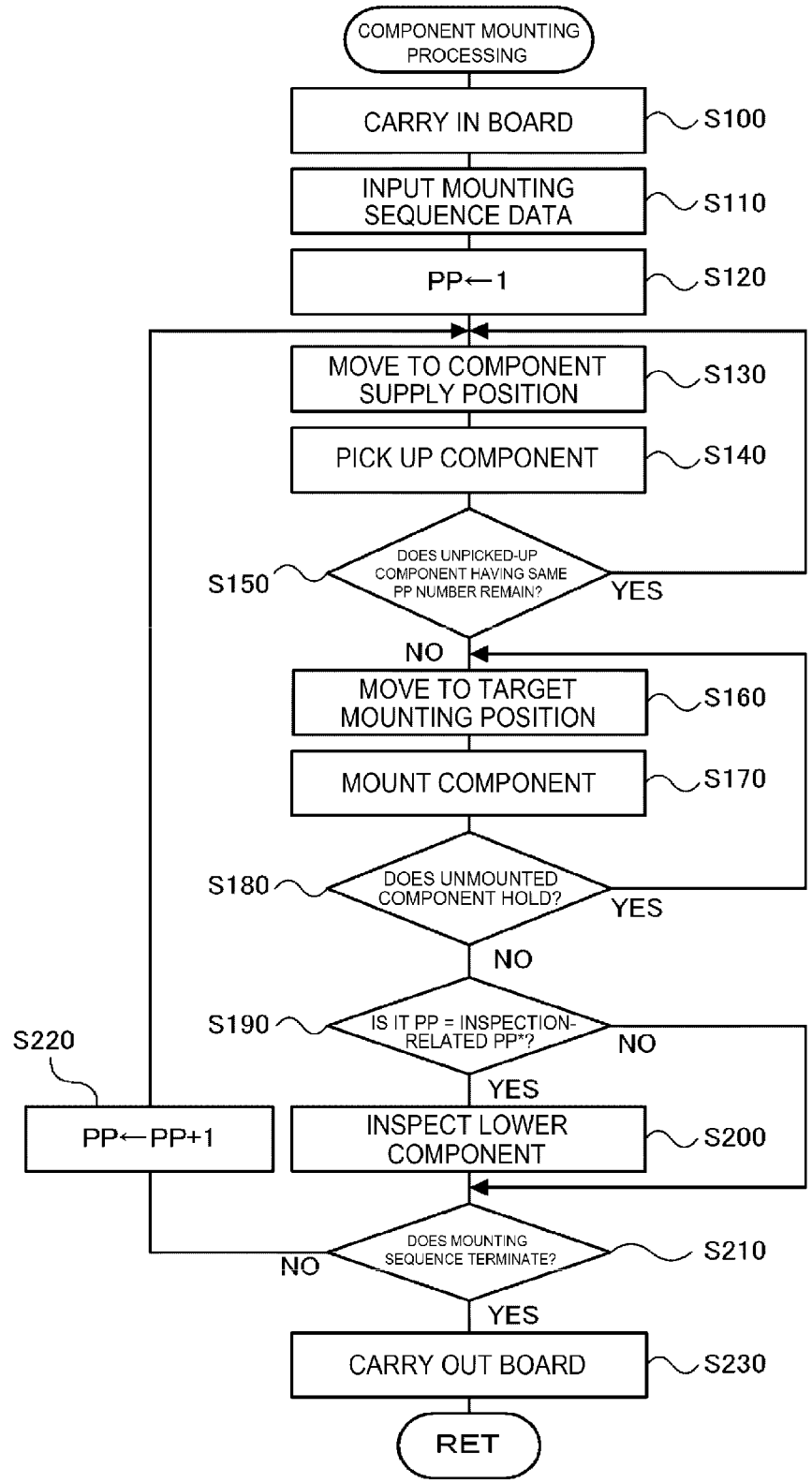
FIG. 5 is a flowchart illustrating an example of component mounting processing.

Next, component mounting processing according to such a mounting sequence will be described. FIG. 5 is a flowchart illustrating an example of component mounting processing executed by CPU 61 of control device 60. This processing is executed when the start of production is instructed by the operator. Control device 60 receives the production job transmitted from management device 80, and executes the component mounting processing based on the received production job.

When the component mounting processing is executed, CPU 61 of control device 60 first controls board conveyance device 22 so that board S is carried in (Step S100). Subsequently, CPU 61 inputs mounting sequence data included in the production job (Step S110), and initializes a pickup number PP to the value 1 (Step S120). Next, CPU 61 controls head moving device 30 so that head 40 is located above the component supply position to which a target component is supplied according to the mounting sequence data (Step S130), and controls head 40 so that the target component is picked up by suction nozzle 45 (Step S140). Specifically, a pickup operation of the target component is performed by driving and controlling Z-axis actuator 43 so that suction nozzle 45 descends until the tip end (suction port) of suction nozzle 45 abuts on the target component, and driving and controlling solenoid valve 53 so that negative pressure acts on the suction port of suction nozzle 45. CPU 61 determines whether an unpicked-up component having the same pickup number PP remains based on the mounting sequence data (Step S150). When it is determined that the unpicked-up component having the same pickup number PP remains, CPU 61 returns to Step S130 to repeat the pickup operation of the target component. For example, in a case where suction nozzle 45 is mounted on each of the four nozzle holders provided in head 40, head 40 can hold up to four target components. Therefore, these target components are set to the same pickup number PP.

On the other hand, when it is determined that no unpicked-up component having the same pickup number PP remains, CPU 61 controls head moving device 30 so that head 40 is located above the target mounting position (Step S160). CPU 61 moves head 40 so that the picked-up component passes over component camera 23, images the component when the component passes above component camera 23, calculates the amount of pickup deviation of the component based on the obtained captured image, and corrects the target mounting position based on the calculated amount of pickup deviation. Subsequently, CPU 61 controls head 40 so that the target component is mounted at the target mounting position (Step S170). Specifically, the mounting operation of the target component is performed by driving and controlling Z-axis actuator 43 so that suction nozzle 45 descends until the target component abuts on the surface of board S, and driving and controlling solenoid valve 53 so that positive pressure acts on the suction port of suction nozzle 45. CPU 61 determines whether an unmounted component is held in head 40 (Step S180). When it is determined that an unmounted component is held in head 40, CPU 61 returns to Step S160, and repeats the processing for moving the target component above the target mounting position and mounting the target component at the target mounting position.

On the other hand, when it is determined that no unmounted component is held in head 40, CPU 61 determines whether the current pickup number PP matches the inspection-related pickup number PP* (Step S190). When it is determined that the current pickup number PP matches the inspection-related pickup number PP*, CPU 61 inspects the lower component (Step S200) and proceeds to Step S210, and when it is determined that these numbers do not match each other, CPU 61 skips Step S200 and proceeds to Step S210. Here, the inspection-related pickup number PP* indicates the timing (inspection timing) at which the inspection of the lower component is performed. The inspection timing is set by inspection timing setting processing described later. In the present embodiment, the mounting inspection of the lower component is performed at a timing immediately after the mounting operation of all the target components in the pickup number PP having the same number as the inspection-related pickup number PP* is completed. The mounting inspection may be performed, for example, by imaging board S after the mounting operation of the component with mark camera 25, performing image processing for recognizing the component in the obtained captured image, determining that the component is normally mounted when the recognition of the component is successful, and determining that the component is not normally mounted when the recognition of the component is unsuccessful. In addition, the mounting inspection may be performed by calculating the amount of mounting deviation (the positional deviation amount or the rotational deviation amount) of the component to board S from the recognition result of the component, determining that the component is normally mounted when the calculated amount of mounting deviation is within the allowable range, and determining that the component is not normally mounted when the calculated amount of mounting deviation exceeds the allowable range.

Next, CPU 61 determines whether the mounting sequence is terminated (Step S210). When it is determined that the mounting sequence is not terminated, CPU 61 increments the pickup number PP by the value 1 (Step S220), returns to Step S130, and repeats the processing for executing the pickup operation or the mounting operation of the target component at the updated pickup number PP and executing the inspection operation as required. When it is determined that the mounting sequence is terminated in Step S210, CPU 61 controls board conveyance device 22 so that board S is carried out (Step S230), and terminates the present processing.

Figures 6, 7A, 7B:
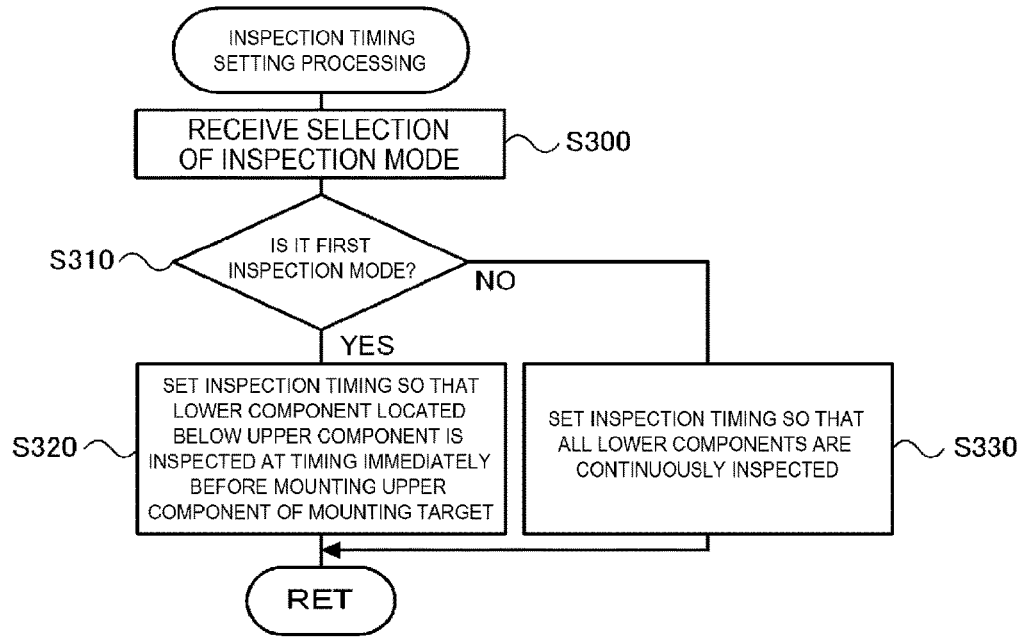
FIG. 6 is a flowchart illustrating an example of inspection timing setting processing.
FIG. 7A is an explanatory table illustrating an example of inspection timing setting data.
FIG. 7B is an explanatory table illustrating an example of inspection timing setting data.

Next, the inspection timing setting processing will be described. FIG. 6 is a flowchart illustrating an example of inspection timing setting processing executed by CPU 81 of management device 80. When the inspection timing setting processing is executed, CPU 81 of management device 80 first receives a selection of the inspection mode (Step S300). This processing is performed, for example, by displaying an inspection mode selection screen for selecting an inspection mode on display 88, and receiving an input of an inspection mode desired by the operator from among the selections displayed on the inspection mode selection screen via input device 87. The selection of the inspection mode includes a first inspection mode and a second inspection mode. The first inspection mode is a mode in which an inspection timing is specified with priority given to the reliability of the inspection. On the other hand, the second inspection mode is a mode in which the inspection timing is specified with priority given to the production efficiency over the reliability of the inspection.

When the selection of the inspection mode is received, CPU 81 determines whether the received inspection mode is the first inspection mode (Step S310). When it is determined that the received inspection mode is the first inspection mode, CPU 81 creates inspection timing setting data so that the lower component located below the upper component is inspected at a timing immediately before mounting the upper component of a mounting target (Step S320), and terminates the present processing. On the other hand, when it is determined that the received inspection mode is not the first inspection mode but the second inspection mode, CPU 81 creates inspection timing setting data so that all lower components are continuously inspected (Step S330), and terminates the present processing.

FIGS. 7A and 7B are explanatory tables illustrating an example of inspection timing setting data. FIGS. 7A and 7B illustrate inspection timing setting data used in a case where mounting work is performed according to the mounting sequence illustrated in FIG. 4 described above. In addition, in FIGS. 7A and 7B, the numbers in the column of the related pickup number PP* (related PP number) indicate that the mounting inspection of the lower component is performed after all the target components in the numbers (pickup number PP) are mounted. In the mounting sequence of FIG. 4, component mounting machine 10 mounts all four other components D-21 to D-24 at the pickup number PP=6, and then mounts one component C-25 on mounted lower components A-1 to A-4, B-13, and B-14 at the pickup number PP=7. After mounting component C-25, component mounting machine 10 mounts one component C-26 on mounted lower components A-5 to A-8, B-15, and B-16 at the pickup number PP=8. After mounting component C-26, component mounting machine 10 mounts one component C-27 on mounted lower components A-9 to A-12, B-17, and B-18 at the pickup number PP=9.

In the first inspection mode, as illustrated in FIG. 7A, the inspection of lower components A-1 to A-4, B-13, and B-14 to be concealed below upper component C-25 is performed at a timing immediately after last other component D-24 is mounted at the pickup number PP=6, that is, at a timing immediately before upper component C-25 is mounted at the pickup number PP=7. In addition, in the first inspection mode, the inspection of lower components A-5 to A-8, B-15, and B-16 to be concealed below upper component C-26 is performed at a timing immediately after upper component C-25 is mounted at the pickup number PP=7, that is, at a timing immediately before upper component C-26 is mounted at the pickup number PP=8. Furthermore, in the first inspection mode, the inspection of lower components A-9 to A-12, B-17, and B-18 to be concealed below upper component C-27 is performed at a timing immediately after upper component C-26 is mounted at the pickup number PP=8, that is, at a timing immediately before upper component C-27 is mounted at the pickup number PP=9. As described above, in the first inspection mode, the inspection of the lower component is performed at a timing immediately before the mounting of the upper component to be mounted on the lower component. In the first inspection mode, by ensuring that there is no time between the inspection of the lower component and the mounting operation of the upper component to be mounted on the lower component, it is possible to avoid the invading of foreign matter or the like after the inspection of the lower component is performed until the upper component is mounted on the lower component, so that the reliability of the inspection of the lower component can be enhanced.

On the other hand, in the second inspection mode, as illustrated in FIG. 7B, the inspection of all the lower components A-1 to A-12, B-13 to 18 to be concealed below upper components C-25 to C-27 is continuously performed at a timing immediately after last other component D-24 is mounted at the pickup number PP=6, that is, at a timing immediately before upper component C-25 is mounted at the pickup number PP=7. As described above, in the second inspection mode, by collectively performing the inspection of all the lower components, the inspection time can be shortened, so that the production efficiency can be enhanced.

Since the selection of the first inspection mode and the second inspection mode can be arbitrarily performed by the operation of the user, it is possible to appropriately respond to the different needs of the user.

Here, the correspondence between the main elements of the embodiments and the main elements of the present disclosure will be described. That is, head 40 corresponds to the head, head moving device 30 corresponds to the head moving device, mark camera 25 corresponds to the imaging device, and control device 60 corresponds to the control device.

It goes without saying that the present disclosure is not limited to the above-described embodiments, and can be implemented in various aspects as long as it belongs to the technical scope of the disclosure of the present disclosure.

For example, in the above embodiment, the inspection timing setting data indicates that the inspection is performed after the mounting operation of all the target components is performed at the pickup number PP matching with the related pickup number PP*. However, as illustrated in FIGS. 8A and 8B, the inspection timing setting data may indicate that the inspection is performed before the mounting operation of the first target component is performed at the pickup number PP matching the related pickup number PP*. In addition, the inspection timing setting data may indicate whether to execute the inspection at each pickup number PP at that timing, as illustrated in FIGS. 9A and 9B.

In addition, in the above embodiment, the inspection timing setting data is provided separately from the mounting sequence data. However, the inspection timing setting data may be incorporated in the mounting sequence data and configured as work sequence data including the mounting work and the inspection work. As illustrated in FIGS. 10A and 10B, the work sequence data is configured by associating work contents, a work target, and a work group number with each other for each work number. Component mounting machine 10 performs work on the work target associated with the work number in the order of the work number with the work contents associated with the work number. Here, the work contents include the mounting work of the target component and the mounting inspection of the target component. In addition, the work target includes a component type of the target component in a case of performing the mounting work, and includes information (inspection 1, inspection 2, and inspection 3) for identifying the inspection target in a case of performing the mounting inspection. In addition, the work group number corresponds to the pickup number described above in the case of performing the mounting work.

Figure 11:
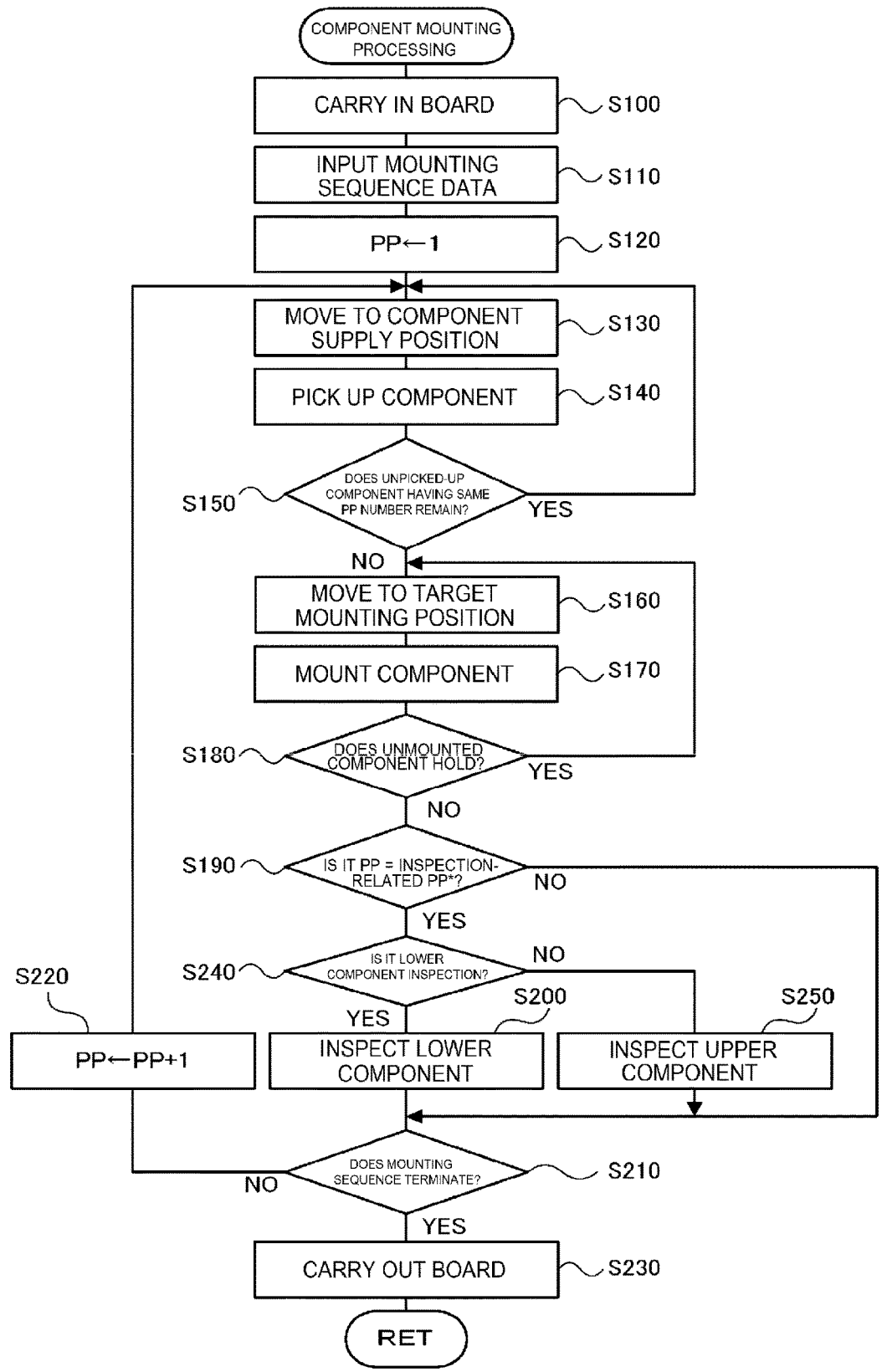
FIG. 11 is a flowchart illustrating component mounting processing of a modification example.

In addition, in the above embodiment, component mounting machine 10 is configured to perform the mounting of the lower component, the mounting of the upper component, and the inspection of the lower component, and may also be configured to perform the inspection of the upper component in addition to these work. FIG. 11 is a flowchart illustrating component mounting processing of a modification example executed by CPU 61 of control device 60. The same processing as those of the component mounting processing of the embodiment of each processing of the component mounting processing of the modification example are assigned with the same step numbers, and descriptions thereof will be omitted because the descriptions are duplicated.

When the component mounting processing of the modification example illustrated in FIG. 11 is executed, and it is determined in Step S190 that the current pickup number PP matches the inspection-related pickup number PP*, CPU 61 determines whether the inspection type is the lower component inspection (Step S240). When it is determined that the inspection type is the lower component inspection, CPU 61 inspects the lower component (Step S200), proceeds to Step S210, when it is determined that the inspection type is not the lower component inspection but the upper component inspection, inspects the upper component (Step S250), and proceeds to Step S210. FIGS. 12A and 12B are explanatory tables illustrating inspection timing setting data of the modification example. FIGS. 12A and 12B illustrate inspection timing setting data used in a case where the mounting work is performed according to the mounting sequence data in FIG. 4. As illustrated in the figure, in the modification example, the inspection timing of the upper component is set so that the inspection of upper components C-25 to C-27 is performed after last upper component C-27 among upper components C-25 to C-27 is mounted at the pickup number PP=9 in both the first inspection mode and the second inspection mode.

In addition, in the above embodiment, the inspection mode is provided with the first inspection mode in which the mounting inspection of the lower component located below the upper component of the mounting target is performed immediately before mounting the upper component of the mounting target among multiple upper components, and the second inspection mode in which the mounting inspection of all the lower components is continuously performed, and component mounting machine 10 performs the mounting inspection in the inspection mode selected from the first inspection mode and the second inspection mode. However, when a component is mounted according to the mounting sequence, component mounting machine 10 may execute the first inspection mode regardless of the user's selection in a case where the second inspection mode cannot be executed (for example, in a case where lower components A-1 to A-4, B-13, and B-14 are mounted, and then upper components C-25 are mounted before lower components A-5 to A-8, B-15, and B-16 are mounted).

Furthermore, in the above embodiment, the inspection mode is provided with the first inspection mode in which the mounting inspection of the lower component located below the upper component of the mounting target is performed immediately before mounting the upper component of the mounting target among multiple upper components, and the second inspection mode in which the mounting inspection of all the lower components is continuously performed. However, other inspection modes different from the first inspection mode and the second inspection mode may be provided. For example, as another inspection mode, a third inspection mode may be provided in which the user can arbitrarily designate the execution timing of the mounting inspection of the lower component after the lower component is mounted based on the mounting sequence.

As described above, a component mounting machine of the present disclosure that mounts a component on a board, the component mounting machine, and it is a gist to include a head configured to hold the component; a head moving device configured to move the head; an imaging device configured to be provided to move together with the head by the head moving device and configured to image the board; and a control device configured to execute a lower component mounting operation that controls the head and the head moving device so that a lower component is mounted on the board, an upper component mounting operation that controls the head and the head moving device so that an upper component is mounted on the lower component mounted on the board, and a lower component mounting inspection operation that controls the imaging device and the head moving device so as to image the board on which the lower component is mounted and performs a mounting inspection of the lower component based on a captured image of the board after the lower component mounting operation is performed and before the upper component mounting operation is performed, in which in a case where each of the upper components is mounted on different lower components among multiple lower components mounted on the board, the control device executes the lower component mounting inspection operation in an inspection mode selected from multiple inspection modes including a first inspection mode in which the mounting inspection of the lower component located below the upper component of a mounting target is performed immediately before the upper component mounting operation of each of the upper components is performed as an execution timing of the lower component mounting inspection operation and a second inspection mode in which all mounting inspections of the multiple lower components are continuously performed.

The control device of the component mounting machine of the present disclosure executes the lower component mounting operation, the upper component mounting operation, and the lower component mounting inspection operation that performs the mounting inspection of the lower component after the lower component mounting operation is performed and before the upper component mounting operation is performed. In addition, in a case where each of the upper components is mounted on different lower components among multiple lower components mounted on the board, the control device executes the lower component mounting inspection operation in the inspection mode selected from multiple inspection modes including the first inspection mode and the second inspection mode. The first inspection mode is a mode in which the mounting inspection of the lower component located below the upper component of a mounting target is performed immediately before the upper component mounting operation of each of the upper components is performed as the execution timing of the lower component mounting inspection operation, and the second inspection mode is a mode in which all mounting inspections of multiple lower components are continuously performed. As a result, it is possible to appropriately respond to user needs by performing the lower component mounting inspection operation in the first inspection mode for a user who gives a priority to the reliability of the inspection, and in the second inspection mode for a user who gives a priority to the production efficiency than the reliability of the inspection.

In such a component mounting machine of the present disclosure, the control device may perform the lower component mounting inspection operation in the inspection mode selected by an operation of an operator from the multiple inspection modes. As a result, the inspection mode can be easily selected.

In addition, in the component mounting machine of the present disclosure, the control device may execute an upper component mounting inspection operation that controls the imaging device and the head moving device so as to image the board on which the upper component is mounted after the upper component mounting operation is performed, and performs a mounting inspection of the upper component based on the captured image of the board. As a result, the component mounting machine can execute the mounting and the inspection of each of the lower component and the upper component by a single body.

INDUSTRIAL APPLICABILITY

The present disclosure can be applied in a manufacturing industry for the component mounting machine or the like.

REFERENCE SIGNS LIST

10 component mounting machine, 11 housing, 21 component supply device, 22 board conveyance device, 23 component camera, 24 nozzle station, 25 mark camera, 30 head moving device, 31 X-axis guide rail, 32 X-axis slider, 33 X-axis actuator, 35 Y-axis guide rail, 36 Y-axis slider, 37 Y-axis actuator, 40 head, 41 R-axis actuator, 42 θ-axis actuator, 43 Z-axis actuator, 51 negative pressure source, 52 positive pressure source, 53 solenoid valve, 60 control device, 61 CPU, 62 ROM, 63 HDD, 64 RAM, 65 input and output interface, 66 bus, 80 management device, 81 CPU, 82 ROM, 83 HDD, 84 RAM, 85 input and output interface, 86 bus, 87 input device, 88 display, S board

The invention claimed is:

1. A component mounting machine that mounts components on a board, the component mounting machine comprising:
    a head configured to hold the components and mount the components onto the board;
    a head moving device configured to move the head;
    an imaging device provided to move together with the head by the head moving device and configured to image the board; and
    a controller configured to control the operation of the head, the head moving device, and the imaging device, wherein the controller is configured to execute a lower component mounting operation that controls the head and the head moving device so that lower components are mounted on the board, an upper component mounting operation that controls the head and the head moving device so that upper components are mounted on the lower components mounted on the board such that respective ones of the lower components are located below each of the upper components, and a lower component mounting inspection operation that controls the imaging device and the head moving device so as to image the board on which the lower components are mounted and performs a mounting inspection of the lower components based on the imaging of the board on which the lower components are mounted after the lower component mounting operation is performed and before the upper component mounting operation is performed, wherein
    the control device executes the lower component mounting inspection operation in an inspection mode selected from multiple inspection modes including a first inspection mode in which the lower component mounting inspection of the respective ones of the lower components located below a respective one of the upper components is performed immediately before the upper component mounting operation for the respective one of the upper components, which is sequentially performed for each of the upper components and a second inspection mode in which the lower components are all inspected continuously before the upper component mounting operation of the upper components.

2. The component mounting machine according to claim 1, wherein the controller performs the lower component mounting inspection operation in an inspection mode selected by an operator from the multiple inspection modes.

3. The component mounting machine according to claim 1, wherein the controller executes an upper component mounting inspection operation that controls the imaging device and the head moving device so as to image the board on which the upper component is mounted on the lower components after the upper component mounting operation is performed, and performs a mounting inspection of the upper component based on the captured image of the board after the upper component mounting operation is performed.

* * * * *